(12) United States Patent
Qin et al.

(10) Patent No.: US 11,245,096 B2
(45) Date of Patent: Feb. 8, 2022

(54) DISPLAY PANEL, METHOD FOR MANUFACTURING DISPLAY PANEL AND DISPLAY APPARATUS

(71) Applicant: BOE TECHNOLOGY GROUP CO., LTD., Beijing (CN)

(72) Inventors: Chengjie Qin, Beijing (CN); Tao Wang, Beijing (CN); Song Zhang, Beijing (CN); Chunyan Xie, Beijing (CN); Ziyu Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 23 days.

(21) Appl. No.: 16/648,413

(22) PCT Filed: Aug. 23, 2019

(86) PCT No.: PCT/CN2019/102253
§ 371 (c)(1),
(2) Date: Mar. 18, 2020

(87) PCT Pub. No.: WO2020/043021
PCT Pub. Date: Mar. 5, 2020

(65) Prior Publication Data
US 2020/0266385 A1    Aug. 20, 2020

(30) Foreign Application Priority Data
Aug. 29, 2018   (CN) .......................... 201810992678.0

(51) Int. Cl.
*H01L 51/52*    (2006.01)
*H01L 27/32*    (2006.01)
*H01L 51/56*    (2006.01)

(52) U.S. Cl.
CPC ...... *H01L 51/5253* (2013.01); *H01L 27/3246* (2013.01); *H01L 51/56* (2013.01); *H01L 2227/323* (2013.01)

(58) Field of Classification Search
CPC . H01L 51/5253; H01L 51/56; H01L 27/3246; H01L 2227/323
See application file for complete search history.

(56) References Cited

U.S. PATENT DOCUMENTS

2014/0131683 A1    5/2014   Kim et al.
2016/0190389 A1*   6/2016   Lee .................... H01L 27/1255
                                                              257/93

(Continued)

FOREIGN PATENT DOCUMENTS

CN    101276083 A    10/2008
CN    204271142 U    4/2015

(Continued)

OTHER PUBLICATIONS

PCT International Search Report, Application No. PCT/CN2019/102253, dated Oct. 28, 2019, 6 pages: with English translation.

(Continued)

*Primary Examiner* — Shaun M Campbell
(74) *Attorney, Agent, or Firm* — Armstrong Teasdale LLP (57) ABSTRACT

The embodiments of the present disclosure provide a display panel, a method for manufacturing a display panel, and a display apparatus. The display panel includes a hole located in a display area of the display panel and penetrating the display panel, and an isolation structure located around the hole and partially penetrating the display panel, wherein a heat resistance of a material of the isolation structure is greater than that of a material adjacent to the isolation structure.

17 Claims, 5 Drawing Sheets

(56) References Cited

U.S. PATENT DOCUMENTS

2017/0288004 A1   10/2017  Kim et al.
2018/0076230 A1    3/2018  Kwak et al.
2020/0006701 A1*  1/2020  Lee .................... H01L 27/3227

FOREIGN PATENT DOCUMENTS

| CN | 105870087 A | 8/2016 |
| CN | 106373990 A | 2/2017 |
| CN | 106876428 A | 6/2017 |
| CN | 107452894 A | 12/2017 |
| CN | 107464828 A | 12/2017 |
| CN | 107658332 A | 2/2018 |
| CN | 107742476 A | 2/2018 |
| CN | 107968157 A | 4/2018 |
| CN | 108281570 A | 7/2018 |
| CN | 108288634 A | 7/2018 |
| CN | 108364987 A | 8/2018 |
| TW | 200847250 A | 12/2008 |

OTHER PUBLICATIONS

PCT Written Opinion, Application No. PCT/CN2019/102253, dated Oct. 28, 2019, 4 pages.: with English translation of relevant part.
China First Office Action, Application No. 201810992678.0, dated Oct. 11, 2021, 26 pps.: with English translation.

\* cited by examiner

DISPLAY PANEL, METHOD FOR MANUFACTURING DISPLAY PANEL AND DISPLAY APPARATUS

CROSS REFERENCE TO RELATED APPLICATIONS

This patent application is a National Stage Entry of PCT/CN2019/102253 filed on Aug. 23, 2019, which claims the benefit and priority of Chinese Patent Application No. 201810992678.0 filed on Aug. 29, 2018, the disclosures of which are incorporated by reference herein in their entirety as part of this application.

BACKGROUND

The present disclosure relates to the field of display techniques, and in particular, to a display panel, a method for manufacturing a display panel and a display apparatus.

Flexible OLED (Organic Light-Emitting Diode) display is widely used in intelligent terminal products such as mobile phones and tablet computers. Because the appearance of flexible OLED display is easy to customize, more and more terminal manufacturers apply it to full-screen and frameless products. In actual applications, it is usually necessary to drill holes in full-screen and frameless products, so as to reserve an installation position to install hardware such as a front-facing camera, an earpiece, and a home key.

BRIEF DESCRIPTION

Embodiments of the present disclosure provide a display panel, a method for manufacturing a display panel and a display apparatus.

A first aspect of the present disclosure provides a display panel. The display panel includes a hole located in a display area of the display panel and penetrating the display panel, and an isolation structure located around the hole and partially penetrating the display panel, wherein a heat resistance of a material of the isolation structure is greater than a heat resistance of a material adjacent to the isolation structure.

In an embodiment of the present disclosure, the display panel further includes a substrate, a thin film transistor on the substrate, a first insulating layer on the thin film transistor, a second insulating layer on the first insulating layer, a third insulating layer on the second insulating layer, wherein the isolation structure includes a first portion extending through the first insulating layer, a second portion extending through the second insulating layer, and a third portion extending through the third insulating layer, wherein a top of the third portion covers a surface of the third insulating layer facing away from the substrate.

In an embodiment of the present disclosure, the display panel further includes a fourth insulating layer covering the third insulating layer and the top of the third portion, and a fifth insulating layer covering the fourth insulating layer and a sidewall of the third portion.

In an embodiment of the present disclosure, the isolation structure extends at least to a gate insulating layer of the thin film transistor in a direction toward the substrate.

In an embodiment of the present disclosure, the display panel further includes a first metal layer on the first insulating layer, wherein the first portion is disposed in the same layer as the first metal layer, and an orthographic projection of the first metal layer on the substrate at least partially overlaps with an orthographic projection of a gate electrode of the thin film transistor on the substrate.

In an embodiment of the present disclosure, a source/drain electrode of the thin film transistor extends through the first insulating layer and the second insulating layer, and the second portion is disposed in the same layer as the source/drain electrode.

In an embodiment of the present disclosure, the display panel further includes an anode layer on the third insulating layer, wherein the third portion is disposed in the same layer as the anode layer.

In an embodiment of the present disclosure, the first portion and the second portion are disposed in the same layer as the source/drain electrode.

In an embodiment of the present disclosure, the display panel further includes a light emitting layer disposed on the anode layer, and a cathode layer disposed on the light emitting layer, wherein the fourth insulating layer is provided on the anode layer and the light emitting layer and serves as a pixel definition layer, wherein the fifth insulating layer is disposed on the cathode layer and at least partially covers an inside surface of the hole to serve as an encapsulation layer.

A second aspect of the present disclosure provides a method for manufacturing a display panel. The method includes forming an isolation structure partially penetrating the display panel in a display area of the display panel, and forming a hole penetrating the display panel in an area of the display panel surrounded by the isolation structure, wherein a heat resistance of a material of the isolation structure is greater than a heat resistance of a material adjacent to the isolation structure.

In an embodiment of the present disclosure, before forming the hole, the method further includes providing a substrate, forming a thin film transistor on the substrate, forming a first insulating layer covering the thin film transistor on the substrate, forming a first opening in the first insulating layer, forming a first portion of the isolation structure in the first opening, forming a second insulating layer covering the first portion on the first insulating layer, forming a second opening exposing the first portion in the second insulating layer, forming a second portion of the isolation structure in the second opening, forming a third insulating layer covering the second portion on the second insulating layer, forming a third opening exposing the second portion in the third insulating layer, and forming a third portion of the isolation structure in the third opening, wherein a top of the third portion covers a surface of the third insulating layer facing away from the substrate.

In an embodiment of the present disclosure, before forming the hole, the method further includes providing a substrate, forming a thin film transistor on the substrate, forming a first insulating layer covering the thin film transistor on the substrate, forming a second insulating layer on the first insulating layer, forming a second opening through the first insulating layer and the second insulating layer, forming, in the second opening, a first portion of the isolation structure in the first insulation layer and a second portion of the isolation structure in the second insulation layer, forming a third insulating layer covering the second portion on the second insulating layer, forming a third opening exposing the second portion in the third insulating layer, and forming a third portion of the isolation structure in the third opening, wherein a top of the third portion covers a surface of the third insulating layer facing away from the substrate.

In an embodiment of the present disclosure, forming the first portion of the isolation structure includes forming a first isolation material on the first insulating layer, and patterning the first isolation material to form a first portion of the isolation structure in the first opening.

In an embodiment of the present disclosure, the first opening is formed to expose a gate insulating layer of the thin film transistor.

In an embodiment of the present disclosure, the first isolation material includes a metal material, and patterning the first isolation material further forms a first metal layer, an orthographic projection of the first metal layer on the substrate at least partially overlaps with an orthographic projection of a gate electrode of the thin film transistor on the substrate.

In an embodiment of the present disclosure, forming the second portion of the isolation structure includes forming a second isolation material on the second insulating layer, and patterning the second isolation material to form a second portion of the isolation structure in the second opening.

In an embodiment of the present disclosure, the second isolation material includes a metal material, and while the second opening is formed, a fourth opening exposing an active layer of the thin film transistor is further formed through the first insulation layer and the second insulation layer, and patterning the second isolation material further forms a source/drain electrode of the thin film transistor in the fourth opening.

In an embodiment of the present disclosure, forming the third portion of the isolation structure includes forming a third isolation material on the third insulating layer, and patterning the third isolation material to form a third portion of the isolation structure in the third opening.

In an embodiment of the present disclosure, the third isolation material includes a metal material or a metal oxide material, and a fifth opening exposing the source/drain electrode is formed while the third opening is formed, patterning the third isolation material also forms an anode layer in the fifth opening.

In an embodiment of the present disclosure, before forming the hole, the method further includes forming as a pixel defining layer a fourth insulating layer having a sixth opening on the third insulating layer, forming a light emitting layer in the sixth opening, forming a cathode layer on the light emitting layer, forming a seventh opening partially penetrating the display panel in an area surrounded by the isolation structure to expose a sidewall of the third portion, a part of a top of the second portion, and a part of the second insulating layer, and forming a fifth insulating layer as an encapsulation layer on the cathode layer and in the seventh opening, wherein the fourth insulating layer covers the third insulating layer and the top of the third portion, and the fifth insulating layer covers the sidewall of the third portion and at least partially covers an inside surface of the hole.

A third aspect of the present disclosure provides a display apparatus. The display apparatus includes any one of the display panels described in the first aspect of the present disclosure.

Further adaptive aspects and scope will become apparent from the description provided herein. It should be understood that various aspects of the present application may be implemented alone or in combination with one or more other aspects. It should also be understood that the description and specific embodiments herein are intended to be illustrative and not limiting the scope of this application.

BRIEF DESCRIPTION OF THE DRAWINGS

The drawings described herein are only for the purpose of illustrations of the selected embodiments rather than any possible implementation, and they are not intended to limit the scope of this application, in which.

DETAILED DESCRIPTION

Various embodiments will now be described in detail with reference to the drawings, and those embodiments are provided as exemplary embodiments of the present disclosure to enable persons skilled in the art to implement the technical solutions of the present disclosure.

It should be noted that the following drawings and examples are not intended to limit the scope of the present disclosure. In the case where specific elements of the present disclosure can be partially or entirely implemented using known components (or methods or processes), only those portions of such known components (or methods or processes) necessary to understand the present disclosure will be described, and detailed descriptions of other portions of such known components will be omitted so as not to obscure the technical solutions of the present disclosure. Further, various embodiments include equivalents known at present and in future, which are equivalent to the components concerned herein, by means of illustration.

The flowchart described in the present disclosure is just one example. There may be many modifications to the flowchart or the steps described therein without departing from the spirit of the present disclosure. For example, the steps may be performed in a different order, or the steps may be added, deleted, or amended. These modifications are considered as parts of the claimed aspects.

In the description of the present disclosure, the orientations or positional relations indicated by the terms "on", "above", "under", "below", "between", etc. are those illustrated based on the drawings. They are just used to facilitate and simplify the description of the present disclosure, rather than indicating or implying that any mentioned apparatus or element must have a particular orientation, or be constructed or operated in a particular orientation, and hence cannot be construed as limitations to the present disclosure. In addition, when an element or layer is referred to as being "on" another element or layer, it may be directly located on the another element or layer, or there may be an intermediate element or layer, similarly, when an element or layer is referred to as being "under" another element or layer, it may be directly located under the another element or layer, or there may be at least one intermediate element or layer, and when an element or layer is referred to as being "between" two elements or layers, it may be an unique element or layer between the two elements or layers, or there may be more than one intermediate element or layer.

Unless additionally and explicitly pointed out in the context, the singular form of the words used herein and in the appended claims includes the plural form, and vice versa. Thus, when a word is mentioned in the singular form, it usually includes the plural form. Similarly, the words "comprise", "comprise", "contain", "have" and grammatical modifications thereof are intended to be inclusive and indicate that there may be additional elements in addition to the listed elements. Where the term "example" is used herein, and particularly following a group of terms, it is merely exemplary and illustrative, and should not be considered as exclusive or extensive. The terms "first", "second", "third" and the like are just used for description, and should not be understood as indicating or implying any relative importance or formation order.

Figure 1:
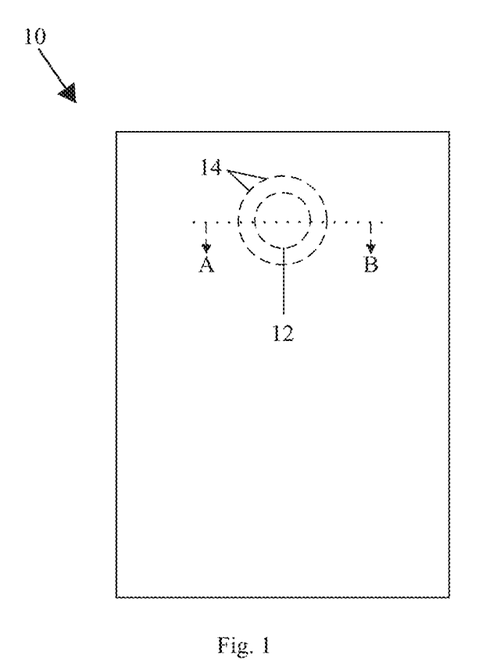
FIG. 1 illustrates a schematic diagram of a display panel according to an embodiment of the present disclosure.
Figure 2:
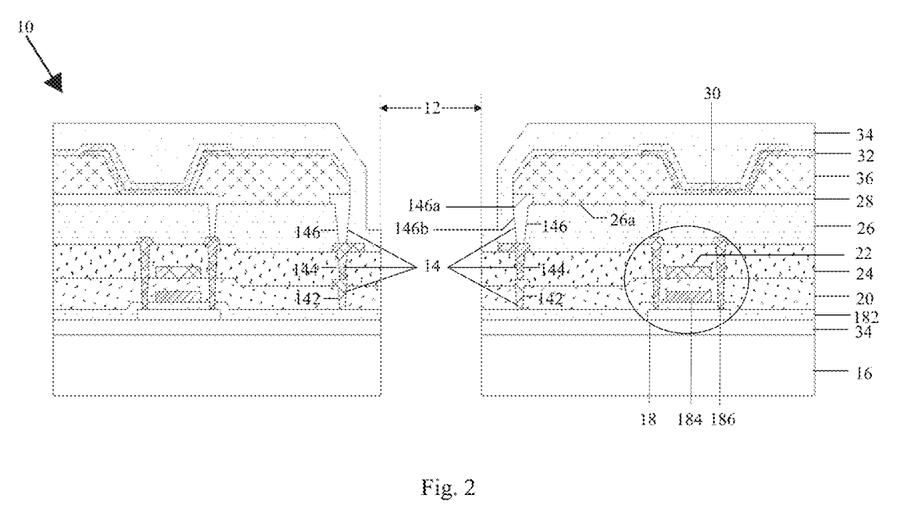
FIG. 2 illustrates a cross-sectional view of a part of the display panel shown in FIG. 1 at line AB according to an embodiment of the present disclosure.

FIG. 1 illustrates a schematic diagram of a display panel 10 according to an embodiment of the present disclosure. FIG. 2 illustrates a cross-sectional view of a part of the display panel 10 illustrated in FIG. 1 at a line AB according to an embodiment of the present disclosure. As shown in FIGS. 1 and 2, the display panel 10 includes a hole 12 and an isolation structure 14 located around the hole 12. The hole 12 may be located in a display area of the display panel 10 and penetrate the display panel 10. The isolation structure 14 is located around the hole 12 and partially penetrates the display panel 10. The heat resistance of the material of the isolation structure 14 is greater than that of the material adjacent to the isolation structure.

According to an embodiment of the present disclosure, since the isolation structure is provided around the hole, and the heat resistance of the material of the isolation structure is greater than the heat resistance of the material adjacent to it. While drilling (for example, laser drilling), it is possible to well define a drilled area for forming a hole, and protect a non-drilled area adjacent to the drilled area from being affected by the drilling operation. In addition, the stress generated by the drilling operation will cause the formation of cracks, and the isolation structure disclosed in the present disclosure can also effectively prevent the cracks from extending. Therefore, the isolation structure disclosed in the present disclosure can improve the quality of the display panel and the pass rate of the display panel. In addition, setting the holes in the display area of the display panel can reduce the area of the frame and increase the effective area of the display area, thereby enabling the production of a full screen.

In the embodiment of the present disclosure, as shown in FIG. 2, the display panel 10 further includes a substrate 16 and a thin film transistor 18 on the substrate 16. The isolation structure 14 extends at least to the gate insulating layer 182 of the thin film transistor 18 in a direction toward the substrate 16. According to an embodiment of the present disclosure, the direction toward the substrate 16 may be perpendicular to the substrate 16.

In the embodiment of the present disclosure, as shown in FIG. 2, the display panel 10 further includes a first insulating layer 20 on the thin film transistor 18. The isolation structure 14 may have a first portion 142 extending through the first insulating layer 20. The display panel 10 further includes a first metal layer 22 on the first insulating layer 20. For example, the first metal layer 22 may form a capacitor with the gate electrode 184. Specifically, as shown in FIG. 2, the orthographic projection of the first metal layer 22 on the substrate 16 may at least partially overlap with the orthographic projection of the gate electrode 184 of the thin film transistor 18 on the substrate 16. According to an embodiment of the present disclosure, the heat resistance of the material of the first portion 142 is greater than that of the material of the first insulating layer 20. In one example embodiment, the first portion 142 may be disposed in the same layer as the first metal layer 22. It should be understood that in the present disclosure, "disposed in the same layer" means that they are formed from the same layer. Therefore, during the manufacturing process, the first portion 142 and the first metal layer 22 can be formed simultaneously by one patterning, simplifying the manufacturing process. The material of the first portion 142 and the first metal layer 22 may include at least one of metal materials such as molybdenum, copper, aluminum, gold, silver, or titanium, or an alloy of the above-mentioned metal material or a laminated structure of the above-mentioned metal material. Since the stress generated during drilling will cause cracks in the first insulating layer 20, if the cracks extend to the non-drilled area, the integrity of the first insulating layer 20 will be deteriorated. However, according to the embodiment of the present disclosure, even if a crack occurs, the first portion 142 can effectively prevent the crack from expanding into the non-perforated area in the first insulating layer.

In the embodiment of the present disclosure, as shown in FIG. 2, the display panel 10 further includes a second insulating layer 24 on the first insulating layer 20. The isolation structure 14 may have a second portion 144 extending through the second insulating layer 24. The heat resistance of the material of the second portion 144 is greater than that of the material of the second insulating layer 24. The source/drain electrode 186 of the thin film transistor 18 extends through the first insulating layer 20 and the second insulating layer 24. In one example embodiment, the second portion 144 may be disposed in the same layer as the source/drain electrode 186. Therefore, during the manufacturing process, the second portion 144 and the source/drain electrode 186 can be formed simultaneously by one patterning, simplifying the manufacturing process. The material of the second portion 144 and the source/drain electrode 186 may include at least one of metal materials such as molybdenum, copper, aluminum, gold, silver, or titanium, or an alloy of the above-mentioned metal materials or a laminated structure of the above-mentioned metal materials. For the same reasons as the first portion 142 of the isolation structure described above, the second portion 144 can also effectively prevent cracks from expanding in the second insulating layer.

In the embodiment of the present disclosure, as shown in FIG. 2, the display panel 10 further includes a third insulating layer 26 on the second insulating layer 24. For example, the third insulating layer 26 may serve as a flat layer. The isolation structure 14 may have a third portion 146 extending through the third insulating layer 26. A top 146a of the third portion 146 covers a surface 26a of the third insulating layer 26 facing away from the substrate 16. The heat resistance of the material of the third portion 146 is greater than that of the material of the third insulating layer 26. The display panel 10 further includes an anode layer 28 on the third insulation layer 26. The anode layer 28 extends through the third insulation layer 26 and is connected to the source/drain electrode 186. In one example embodiment, the third portion 146 may be disposed in the same layer as the anode layer 28. Therefore, during the manufacturing process, the third portion 146 and the anode layer 28 can be simultaneously formed by one patterning, simplifying the manufacturing process. The material of the third portion 146 and the anode layer 28 may include a metal oxide such as indium tin oxide and indium zinc oxide, or a reflective metal such as silver, aluminum, or a laminated material of such as a metal oxide and a reflective metal. For the same reasons as the first portion 142 and the second portion 144 of the isolation structure described above, the third portion 146 can also effectively prevent cracks from expanding in the third insulating layer.

In the embodiment of the present disclosure, as shown in FIG. 2, the display panel 10 further includes a fourth insulating layer 36 covering the third insulating layer 26 and a top 146a of the third portion 146, and a fifth insulating layer 34 covering the fourth insulating layer 36 and a side wall 146b of the third portion 146. In the embodiment of the present disclosure, the fourth insulating layer 36 may be used as a pixel definition layer, and the fifth insulating layer 34 may be used as an encapsulation layer.

Figure 3:
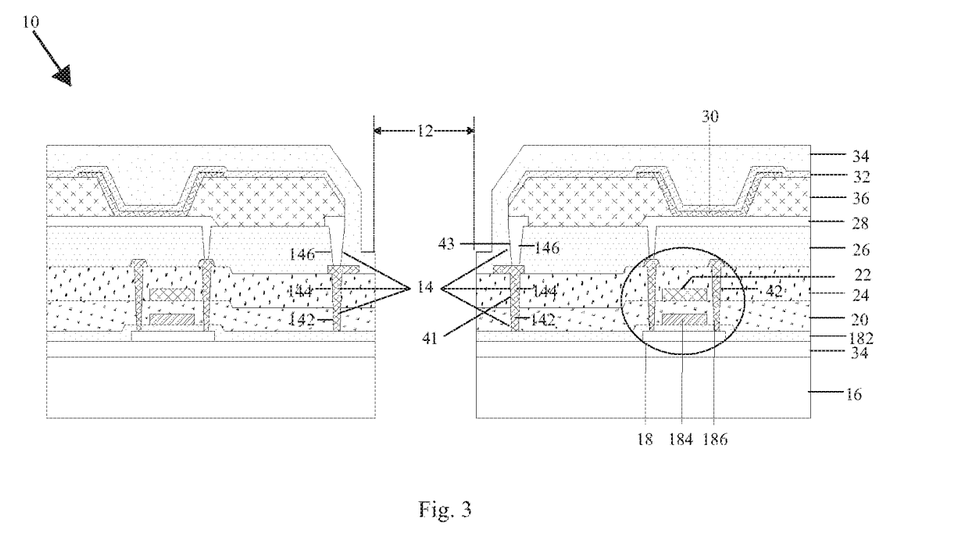
FIG. 3 illustrates a cross-sectional view of a part of the display panel shown in FIG. 1 at a line AB according to another embodiment of the present disclosure.

FIG. 3 illustrates a cross-sectional view of a part of the display panel 10 illustrated in FIG. 1 at a line AB according to another embodiment of the present disclosure. As shown in FIG. 3, the first portion 142 and the second portion 144 may be disposed in the same layer as the source/drain electrodes 186. Therefore, during the manufacturing process, the first portion 142, the second portion 144, and the source/drain electrode 186 can be simultaneously formed by one patterning, thereby simplifying the manufacturing process. That is, the first portion 142 and the second portion 144 may be formed as an integrated structure. The other structures of the display panel shown in FIG. 3 are the same as the other structures of the display panel shown in FIG. 2, and will not be repeated here.

The display panel 10 shown in FIGS. 3 and 2 further includes a light emitting layer 30 provided on the anode layer 28 and a cathode layer 32 provided on the light emitting layer 30. In the embodiment of the present disclosure, the fourth insulating layer 36 is provided between the anode layer 28 and the light emitting layer 30 as the pixel definition layer 36 as described above. In the embodiment of the present disclosure, the fifth insulating layer 34 is provided on the cathode layer 32 as the encapsulation layer 34 as described above, and the fifth insulating layer 34 at least partially covers the inside surface of the hole 12. In one example embodiment, the fifth insulating layer 34 may cover the light emitting layer 30 and the cathode layer 32 adjacent to the edge of the hole 12. This can protect the light emitting layer 30 and the cathode layer 32, prevent them from being oxidized by external water and oxygen, and improve the reliability at the position of the hole 12.

It should be noted that the display panel 10 may further include other film layers, such as a passivation layer 38 between the substrate 16 and the gate insulating layer 182 as shown in FIG. 2 and FIG. 3. The other film layers are not specifically limited.

In addition, the hole described above may be an area for installing a hardware structure, and the hardware structure may include a front-facing camera, a home key, a handset, or a speaker. In addition, the shape of the hole can be determined according to the hardware structure to be installed, and different shapes of holes can be provided for different hardware structures. The cross-sectional shape of the hole in a direction parallel to the substrate may be circular, oval, rectangular, trapezoidal, diamond, square, or other polygon.

Figure 4:
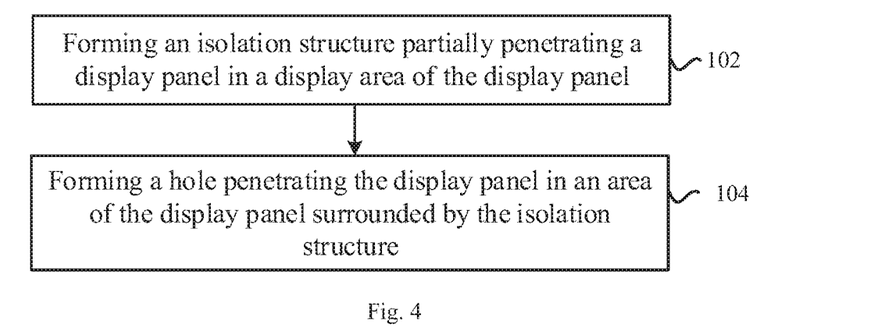
FIG. 4 illustrates a flowchart of a method for manufacturing a display panel according to an embodiment of the present disclosure.

In another aspect of the present disclosure, a method for manufacturing a display panel described herein is provided. FIG. 4 illustrates a flowchart of a method for manufacturing a display panel according to an embodiment of the present disclosure. FIGS. 5A-5G illustrate cross-sectional views of a structure of a display panel manufactured by a method according to an embodiment of the present disclosure.

As shown in FIG. 4, first, in step S102, an isolation structure that partially penetrates the display panel is formed in a display area of the display panel. Next, in step S104, a hole penetrating the display panel is formed in an area of the display panel surrounded by the isolation structure. For example, a laser drilling process may be used to form the hole. In the embodiment of the present disclosure, the heat resistance of the material of the isolation structure is greater than that of the material adjacent to the isolation structure.

In the display panel formed by the above method, since the isolation structure is provided around the holes of the display panel, and the heat resistance of the material of the isolation structure is greater than the heat resistance of the material adjacent to it. While drilling (for example, laser drilling), the isolation structure can well define a drilled area, and protect a non-drilled area adjacent to the drilled area from being affected by the drilling operation, improving the quality of the display panel and the pass rate of the display panel.

Figure 5A:
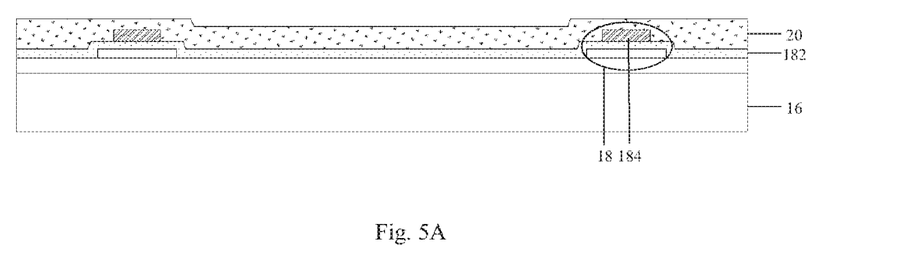
FIGS. 5A-5G illustrate cross-sectional views of a structure of a display panel manufactured by a method according to an embodiment of the present disclosure.
Figure 5B:
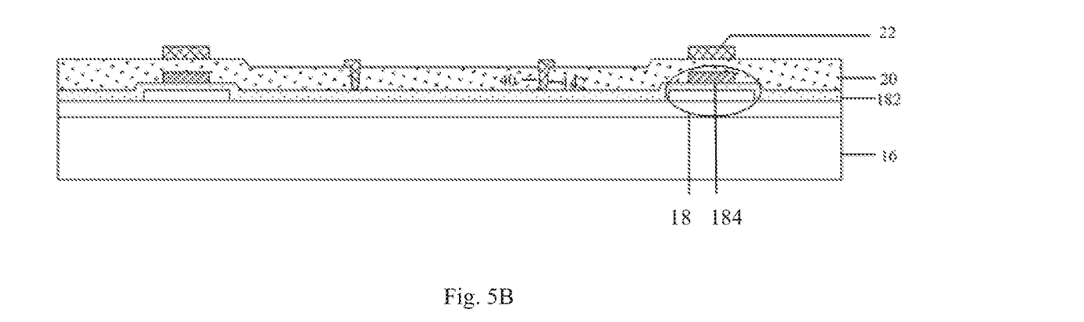
Figure 5C:
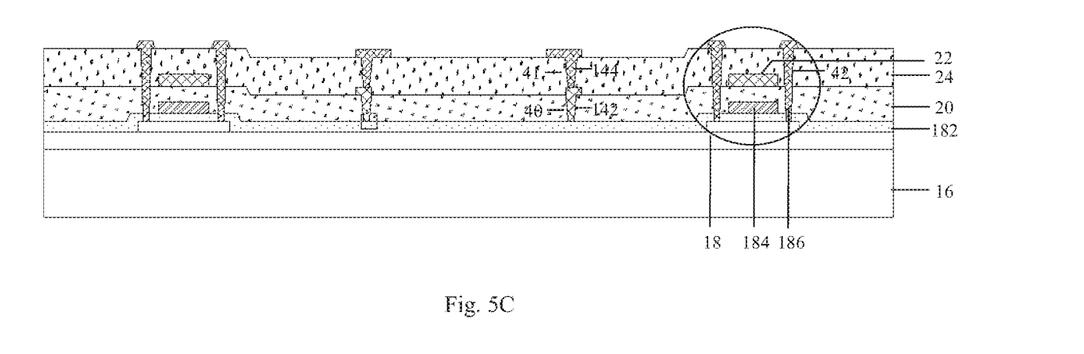
Figure 5D:
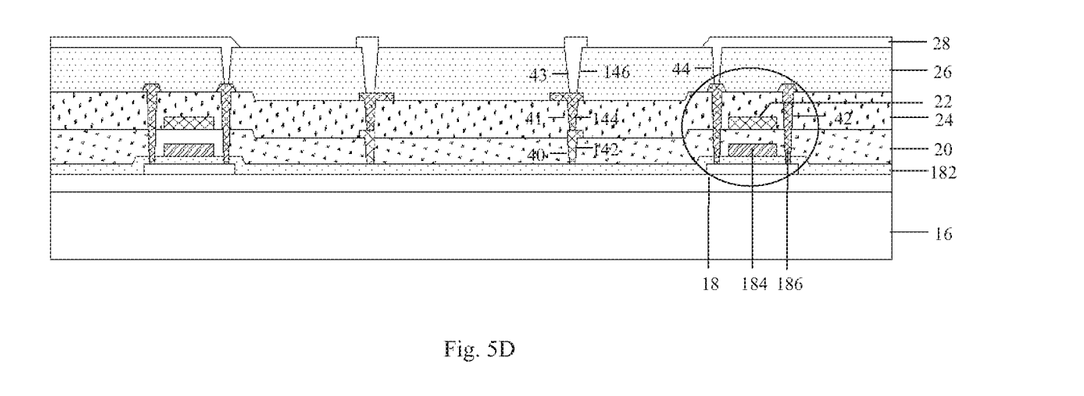

In the embodiment of the present disclosure, before step S104, the method for manufacturing a display panel further includes providing a substrate 16 as shown in FIG. 5A; forming a thin film transistor 18 on the substrate 16; then, forming a first insulating layer 20 covering the thin film transistor 18 on the substrate 16; for example, forming a first opening 40 in the first insulating layer 20 by etching (see FIG. 5B); and then, forming a first portion 142 of the isolation structure in the first opening 40; then, as shown in FIG. 5C, forming a second insulating layer 24 covering the first portion 142 on the first insulating layer 20; forming a second opening 41 in the second insulating layer 24 to expose the first portion 142 (see FIG. 5C); forming a second portion 144 of the isolation structure in the second opening 41; and then, as shown in FIG. 5D, forming a third insulating layer 26 covering the second portion 144 on the second insulating layer 24; forming a third opening 43 in the third insulating layer 26 to expose the second portion 144; forming a third portion 146 of the isolation structure in the third opening 43. In the embodiment of the present disclosure, the top of the third portion 146 covers a surface of the third insulating layer 26 facing away from the substrate 16.

In the embodiment of the present disclosure, forming the first portion 142 of the isolation structure specifically includes forming a first isolation material on the first insulating layer 20; and, as shown in FIG. 5B, patterning the first isolation material to form a first portion 142 of the isolation structure in the first opening 40.

In the embodiment of the present disclosure, the first opening 40 is formed to expose the gate insulating layer 182 of the thin film transistor 18 in a direction toward the substrate 16.

In the embodiment of the present disclosure, the first isolation material may include a metal material, such as at least one of molybdenum, copper, aluminum, gold, silver, or titanium, or an alloy of the above-mentioned metal material or a laminated structure of the above-mentioned metal material. While patterning the first isolation material to form the first portion 142 of the isolation structure, as shown in FIG. 5B, a first metal layer 22 is also formed. For example, the first metal layer 22 may form a capacitor with the gate electrode 184. Specifically, the orthographic projection of the first metal layer 22 on the substrate 16 at least partially overlaps with the orthographic projection of the gate electrode 184 of the thin film transistor 18 on the substrate 16.

In the embodiment of the present disclosure, forming the second portion 144 of the isolation structure specifically includes forming a second isolation material on the second insulating layer 24, and patterning the second isolation material to form the second portion 144 of the isolation structure in the second opening 41.

In the embodiment of the present disclosure, the second isolation material includes a metal material, such as at least one of molybdenum, copper, aluminum, gold, silver, or titanium, or an alloy of the above-mentioned metal material or a laminate structure of the above-mentioned metal material. While the second opening 41 is formed, as shown in FIG. 5C, a fourth opening 42 is formed through the first insulating layer 20 and the second insulating layer 24 to expose the active layer of the thin film transistor 18. While patterning the second isolation material to form the second portion 144 of the isolation structure, the source/drain electrode 186 of the thin film transistor 18 is also formed in the fourth opening 42.

In the embodiment of the present disclosure, forming the third portion 146 of the isolation structure specifically includes forming a third isolation material on the third insulating layer 26, and patterning the third isolation material to form a third portion 146 of the isolation structure in the third opening 43.

In an embodiment of the present disclosure, the third isolation material includes a metal material, such as a metal oxide (for example, indium tin oxide and indium zinc oxide), or a reflective metal (for example, silver, aluminum), or a laminated material formed of a metal oxide and a reflective metal. While the third opening 43 is formed, as shown in FIG. 5D, a fifth opening 44 is also formed to expose the source/drain electrode 186. While patterning the third isolation material to form the third portion 146 of the isolation structure, an anode layer 28 is also formed in the fifth opening 44.

Figure 5E:
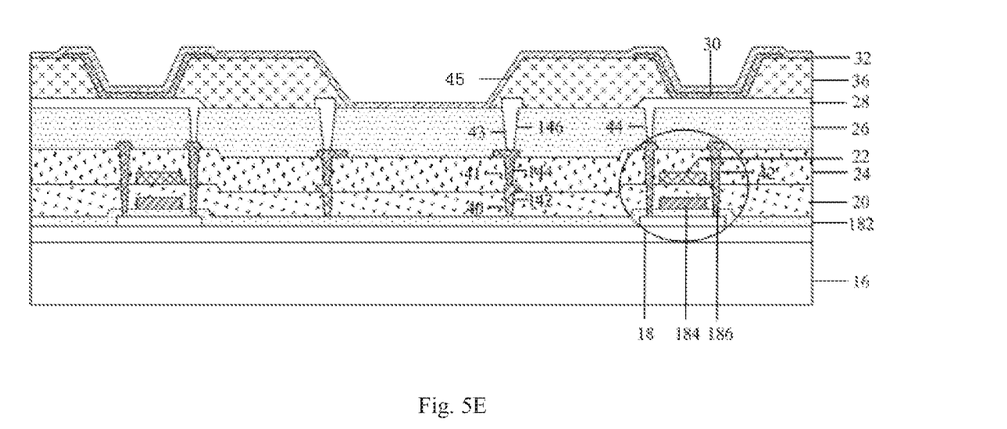
Figure 5F:
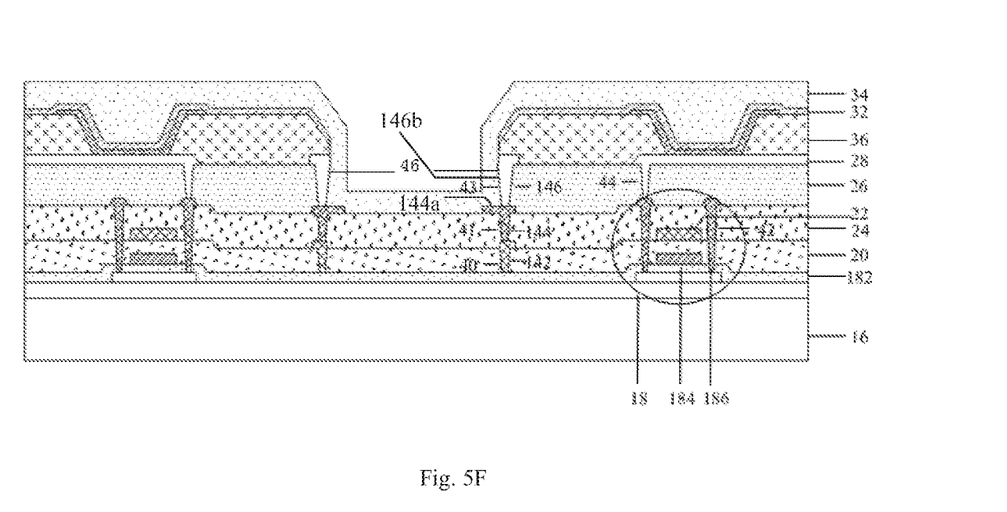

In the embodiment of the present disclosure, before step S104, the method for manufacturing a display panel further includes as shown in FIG. 5E, first, forming a fourth insulating layer 36 having a sixth opening 45 on the third insulating layer 26 as a pixel definition layer; then, forming a light emitting layer 30 in the sixth opening 45; then, forming a cathode layer 32 on the light emitting layer 30; finally, as shown in FIG. 5F, forming a seventh opening 46 penetrating the display panel in an area surrounded by the isolation structure, wherein the seventh opening 46 exposes the side wall 146*b* of the third portion 146, a part of the top 144*a* of the second portion 144, and a part of the second insulating layer 24; finally, forming the fifth insulating layer 34 on the cathode layer 32 and in the seventh opening 46 as the encapsulation layer. In the embodiment of the present disclosure, the fourth insulating layer 36 covers the third insulating layer 26 and the top of the third portion 146, and the fifth insulating layer 34 covers the sidewall 146*b* of the third portion 146 and at least partially covers the inside surface of the hole 12.

In addition, according to an embodiment of the present disclosure, after forming the cathode layer 32 on the light emitting layer 30 and before forming the fifth insulating layer 34 on the cathode layer 32, the display panel is subjected to a drilling operation (for example, laser drilling) in an area surrounded by the isolation structure to form a hole (for example, a hole for mounting).

Figure 5G:
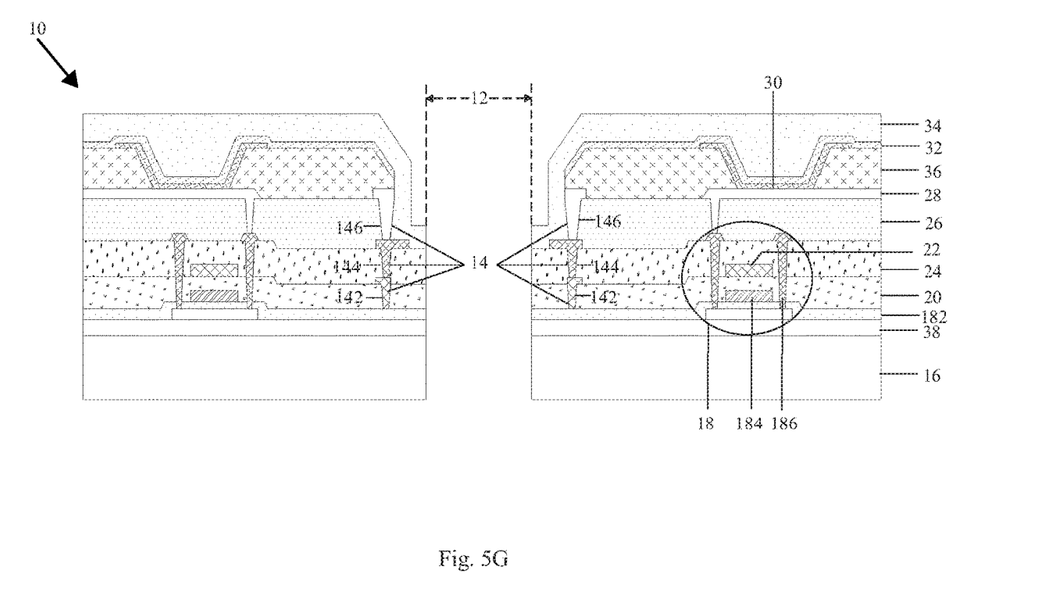

As shown in FIG. 5G, in step S104, a hole 12 penetrating the display panel 10 is formed in an area of the display panel 10 surrounded by the isolation structure 14, for example, a laser drilling process may be used to form the hole. In the embodiment of the present disclosure, the heat resistance of the material of the isolation structure is greater than that of the material adjacent to the isolation structure.

In addition, the fifth insulating layer at least partially covers the inside surface of the hole. In one example embodiment, the fifth insulating layer may cover the light emitting layer and the cathode layer adjacent to the edge of the hole. This can protect the light emitting layer and the cathode layer, prevent them from being oxidized by external water and oxygen, and improve the reliability at the location of the hole.

In another embodiment of the present disclosure, as shown in FIG. 3, before step S104, the method for manufacturing a display panel further includes providing a substrate 16, and forming a thin film transistor 18 on the substrate 16, then, forming a first insulating layer 20 covering the thin film transistor 18 on the substrate 16, then, forming a second insulating layer 24 on the first insulating layer 20, and forming a second opening 41 in the first insulating layer 20 and the second insulating layer 24, forming, in the second opening 41, a first portion 142 in the first insulating layer 20 and a second portion 144 in the second insulating layer 24, and then forming a third insulating layer 26 covering the second portion 144 on the second insulating layer 24, forming a third opening 43 exposing the second portion 144 in the third insulating layer 26, and forming a third portion 146 of the isolation structure in the third opening 43. In the embodiment of the present disclosure, the top of the third portion 146 covers a surface of the third insulating layer 26 facing away from the substrate 16. The method provided by this embodiment is used for the display panel shown in FIG. 3 described in the foregoing embodiment, and its structure, function, and/or advantage are the same as the structure, function, and/or advantage of the display panel in the foregoing embodiment, don't described in detail herein.

In yet another aspect of the present disclosure, a display apparatus including the display panel described in the foregoing embodiment is also provided. Since the isolation structure is provided around the holes of the display panel, and the heat resistance of the material of the isolation structure is greater than the heat resistance of the material adjacent to it, while drilling (for example, laser drilling), the isolation structure can well define a drilled area and protect the non-drilled area adjacent to the drilled area from being affected by the drilling operation, thereby improving the quality of the display apparatus and the pass rate of the display apparatus.

The foregoing descriptions of the embodiments have been provided as above for the purposes of illustration and description, and they are not intended to be exhaustive or to limit this application. Various elements or features of a particular embodiment are generally not limited to that particular embodiment, but where applicable, they are interchangeable and can be used in a selected embodiment, even if not specifically illustrated or described. Similarly, changes may also be made in many ways. Such changes cannot be considered as departures from this application, and all the modifications are included in the scope of this application.

What is claimed is:

1. A display panel comprising:
   a hole located in a display area of the display panel and penetrating the display panel;
   an isolation structure located around the hole and partially penetrating the display panel;
   a substrate;
   a thin film transistor located on the substrate;
   a first insulating layer on the thin film transistor;
   a second insulating layer on the first insulating layer;
   a third insulating layer on the second insulating layer;

a fourth insulating layer covering the third insulating layer and the top of the third portion; and
a fifth insulating layer covering the fourth insulating layer and a sidewall of the third portion,
wherein a heat resistance of a material of the isolation structure is greater than a heat resistance of a material adjacent to the isolation structure,
wherein the isolation structure comprises a first portion extending through the first insulating layer, a second portion extending through the second insulating layer, and a third portion extending through the third insulating layer, and
wherein a top of the third portion covers a surface of the third insulating layer facing away from the substrate.

2. The display panel according to claim 1, wherein the isolation structure extends at least to a gate insulating layer of the thin film transistor in a direction toward the substrate.

3. The display panel according to claim 2, further comprising:
a first metal layer on the first insulating layer, wherein the first portion is disposed in the same layer as the first metal layer, and wherein an orthographic projection of the first metal layer on the substrate at least partially overlaps with an orthographic projection of a gate electrode of the thin film transistor on the substrate.

4. The display panel according to claim 3, wherein a source/drain electrode of the thin film transistor extends through the first insulating layer and the second insulating layer, and wherein the second portion is disposed in the same layer as the source/drain electrode.

5. The display panel according to claim 4, further comprising:
an anode layer on the third insulation layer, wherein the third portion is disposed in the same layer as the anode layer.

6. The display panel according to claim 4, wherein the first portion and the second portion are disposed in the same layer as the source/drain electrode.

7. The display panel according to claim 6, further comprising:
a light emitting layer disposed on the anode layer; and
a cathode layer disposed on the light emitting layer;
wherein the fourth insulating layer is disposed between the anode layer and the light emitting layer and serves as a pixel definition layer, and
wherein the fifth insulating layer is disposed on the cathode layer and at least partially covers an inside surface of the hole to serve as an encapsulation layer.

8. A method for manufacturing a display panel, the method comprising:
forming an isolation structure partially penetrating the display panel in a display area of the display panel;
providing a substrate;
forming a thin film transistor on the substrate;
forming a first insulating layer covering the thin film transistor on the substrate;
forming a first opening in the first insulating layer;
forming a first portion of the isolation structure in the first opening;
forming a second insulating layer covering the first portion on the first insulating layer;
forming a second opening exposing the first portion in the second insulating layer;
forming a second portion of the isolation structure in the second opening;
forming a third insulating layer covering the second portion on the second insulating layer;
forming a third opening exposing the second portion in the third insulating layer;
forming a third portion of the isolation structure in the third opening, wherein a top of the third portion covers a surface of the third insulating layer facing away from the substrate; and
forming a hole penetrating the display panel in an area of the display panel surrounded by the isolation structure,
wherein a heat resistance of a material of the isolation structure is greater than a heat resistance of a material adjacent to the isolation structure.

9. A method for manufacturing a display panel, the method comprising:
forming an isolation structure partially penetrating the display panel in a display area of the display panel;
providing a substrate;
forming a thin film transistor on the substrate;
forming a first insulating layer covering the thin film transistor on the substrate;
forming a second insulating layer on the first insulating layer;
forming a second opening through the first insulating layer and the second insulating layer;
forming, in the second opening, a first portion of the isolation structure in the first insulation layer and a second portion of the isolation structure in the second insulation layer;
forming a third insulating layer covering the second portion on the second insulating layer;
forming a third opening exposing the second portion in the third insulating layer;
forming a third portion of the isolation structure in the third opening, wherein a top of the third portion covers a surface of the third insulating layer facing away from the substrate; and
forming a hole penetrating the display panel in an area of the display panel surrounded by the isolation structure,
wherein a heat resistance of a material of the isolation structure is greater than a heat resistance of a material adjacent to the isolation structure.

10. The method according to claim 8, wherein forming the first portion of the isolation structure comprises:
forming a first isolation material on the first insulating layer; and
patterning the first isolation material to form the first portion of the isolation structure in the first opening.

11. The method according to claim 10, wherein the first opening is formed to expose a gate insulating layer of the thin film transistor.

12. The method according to claim 11, wherein the first isolation material comprises a metal material, wherein patterning the first isolation material further forms a first metal layer, and wherein an orthographic projection of the first metal layer on the substrate at least partially overlaps with an orthographic projection of a gate electrode of the thin film transistor on the substrate.

13. The method according to claim 12, wherein forming the second portion of the isolation structure comprises:
forming a second isolation material on the second insulating layer; and
patterning the second isolation material to form the second portion of the isolation structure in the second opening.

14. The method according to claim 13, wherein the second isolation material comprises a metal material, wherein while the second opening is formed, a fourth opening exposing an active layer of the thin film transistor is further formed through the first insulation layer and the second insulation layer, and wherein patterning the second isolation material further forms a source/drain electrode of the thin film transistor in the fourth opening.

15. The method according to claim 14, wherein forming the third portion of the isolation structure comprises:
   forming a third isolation material on the third insulating layer; and
   patterning the third isolation material to form the third portion of the isolation structure in the third opening.

16. The method according to claim 15, wherein the third isolation material comprises a metal material or a metal oxide material,
   wherein a fifth opening that exposes the source/drain electrode is formed while the third opening is formed,
   wherein patterning the third isolation material also forms an anode layer in the fifth opening, and
   wherein, before forming the hole, the method further comprises:
   forming as a pixel defining layer a fourth insulating layer having a sixth opening on the third insulating layer;
   forming a light emitting layer in the sixth opening;
   forming a cathode layer on the light emitting layer;
   forming a seventh opening partially penetrating the display panel in an area surrounded by the isolation structure to expose a sidewall of the third portion, a part of a top of the second portion, and a part of the second insulating layer; and
   forming a fifth insulating layer as an encapsulation layer on the cathode layer and in the seventh opening,
   wherein the fourth insulating layer covers the third insulating layer and the top of the third portion, and wherein the fifth insulating layer covers the sidewall of the third portion and at least partially covers an inside surface of the hole.

17. A display apparatus comprising the display panel according to claim 1.

* * * * *